United States Patent [19]

Chien et al.

[11] Patent Number: 5,702,869
[45] Date of Patent: Dec. 30, 1997

[54] SOFT ASHING METHOD FOR REMOVING FLUORINATED PHOTORESISTS LAYERS FROM SEMICONDUCTOR SUBSTRATES

[75] Inventors: Rong-Wu Chien, Chyai; Hsiu-Lan Li, Hsinchu, both of Taiwan

[73] Assignee: Vanguard International Semiconductor Corporation, Hsin-Chu, Taiwan

[21] Appl. No.: 660,302

[22] Filed: Jun. 7, 1996

[51] Int. Cl.⁶ ............................................. G03F 7/36
[52] U.S. Cl. .................... 430/313; 430/329; 438/705; 438/738
[58] Field of Search ........................ 430/314, 313, 430/315, 324, 323, 329; 156/628.1, 643.1, 659.11; 438/705, 735, 738

[56] References Cited

U.S. PATENT DOCUMENTS

4,810,601  3/1989  Allen .................................. 430/18
5,443,941  8/1995  Bariya et al. ...................... 430/313
5,543,252  8/1996  Shibata ............................... 430/5

*Primary Examiner*—Kathleen Duda
*Attorney, Agent, or Firm*—George O. Saile; Stephen B. Ackerman; Alek P. Scecsy

[57] ABSTRACT

A method for removing from a semiconductor substrate a partially fluorinated photoresist layer. There is first formed upon a semiconductor substrate a partially fluorinated photoresist layer. The partially fluorinated photoresist layer has a fluorinated surface layer of the partially fluorinated photoresist layer and an underlying non-fluorinated remainder layer of the partially fluorinated photoresist layer. The fluorinated surface layer of the partially fluorinated photoresist layer is then removed through a first etch method. The first etch method employs an oxygen containing plasma at a radio frequency power no greater than about 500 watts and a temperature no greater than about 120 degrees centigrade. Finally, the underlying non-fluorinated remainder layer of the partially fluorinated photoresist layer is removed through a second etch method.

24 Claims, 7 Drawing Sheets

SOFT ASHING METHOD FOR REMOVING FLUORINATED PHOTORESISTS LAYERS FROM SEMICONDUCTOR SUBSTRATES

BACKGROUND OF THE INVENTION

1. Field of the Invention

The present invention relates generally to photoresist layers employed in integrated circuit manufacture. More particularly, the present invention relates to methods for removing from semiconductor substrates photoresist layers which have become fluorinated in the process of integrated circuit manufacture.

2. Description of the Related Art

Integrated circuits are formed upon semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

In the process of connecting and interconnecting electrical circuit elements with patterned conductor layers which are separated by insulator layers within integrated circuits, it is common in the art to form vias and other apertures through those insulator layers such that conductive connections may be made between the patterned conductor layers and the electrical circuit elements which are separated by the insulator layers. Although vias and other apertures within and/or through insulator layers within integrated circuits may be formed through photolithographic methods followed by etch methods including but not limited to wet chemical etch methods and Reactive Ion Etch (RIE) dry plasma etch methods, it has become quite common in the art that vias and other apertures formed within and/or through insulator layers within integrated circuits will typically be formed through Reactive Ion Etch (RIE) dry plasma etch methods. Since insulator layers within integrated circuits are typically formed from silicon containing insulator materials such as silicon oxide insulator materials, silicon nitride insulator materials and silicon oxynitride insulator materials, it is consequently also common in the art that Reactive Ion Etch (RIE) dry plasma etch methods which are employed in forming vias and other apertures within and/or through insulator layers formed of those silicon containing insulator materials will typically employ fluorine containing Reactive Ion Etch (RIE) plasma etchants. Fluorine containing Reactive Ion Etch (RIE) plasma etchants are preferably employed since upon reaction with insulator layers formed of silicon containing insulator materials they form volatile species which are readily exhausted from Reactive Ion Etch (RIE) plasma etch chambers.

While vias and other apertures within and/or through silicon containing insulator layers may typically be effectively etched by means of fluorine containing Reactive Ion Etch (RIE) plasma etchants, fluorine containing Reactive Ion Etch (RIE) plasma etchants are not without problems in etching within integrated circuits insulator layers formed of silicon containing materials. In particular, fluorine containing Reactive Ion Etch (RIE) plasma etchants are known in the art to partially fluorinate patterned photoresist layers which are employed as etch masks through which vias and/or apertures within and/or through silicon containing insulator layers within integrated circuits are patterned. The partially fluorinated patterned photoresist layers typically have a fluorinated surface layer of the partially fluorinated patterned photoresist layer and a non-fluorinated underlying remainder layer of the partially fluorinated patterned photoresist layer.

The fluorinated surface layers of partially fluorinated patterned photoresist layers are often difficult to effectively remove through either high power dry plasma photoresist stripping methods or wet chemical photoresist stripping methods as are known in the art. For example, when fluorinated surface layers of partially fluorinated patterned photoresist layers are removed through high power dry plasma photoresist stripping methods, damage often occurs to exposed layers adjoining the fluorinated surface layers In addition, when a via is etched through a silicon containing insulator layer to reach a conductor metal contact beneath the silicon containing insulator layer, the metal-polymer residue which typically forms upon the via sidewall is also typically sufficiently oxidized in a high power dry oxygen plasma photoresist stripping method to make the metal-polymer residue difficult to remove subsequent to the high power dry oxygen plasma photoresist stripping method. Further, under circumstances where a fluorinated surface layer of a partially fluorinated patterned photoresist layer is dislodged by dissolving in a wet chemical photoresist stripping solution a non-fluorinated underlying remainder portion of the partially fluorinated patterned photoresist layer, the fluorinated surface portion of the partially fluorinated patterned photoresist layer often redistributes upon the surface of the integrated circuit from which it was dislodged, thus obscuring the features of the integrated circuit from further processing. By obscuring features of the integrated circuit from further processing, it often becomes difficult to form fully functional or reliable integrated circuits. Moreover, when a substantial concentration of fluorinated surface portions of the partially fluorinated patterned photoresist layers remains in a wet chemical photoresist stripping solution, the active lifetime of the wet chemical photoresist stripping solution is decreased. Finally, the lifetime of a recirculating filter employed in purifying the wet chemical photoresist stripping solution having contained therein a substantial concentration of fluorinated surface portions of partially fluorinated patterned photoresist layers is also decreased.

It is thus an object of the present invention to provide a method for removing from integrated circuit layers within integrated circuits fluorinated photoresist layers in a fashion such that: (1) layers surrounding the fluorinated photoresist layers are not damaged; (2) the fluorinated photoresist layers do not leave a residue which impedes formation of fully functional or reliable integrated circuits; or (3) the metal-polymer residue which typically forms upon the sidewall of a via formed through a silicon containing insulator layer to a conductor metal contact while employing a patterned fluorinated photoresist layer as an etch mask is not sufficiently oxidized to make the metal-polymer residue difficult to remove.

Methods through which Anti-Reflection Coating (ARC) halocarbon plasma polymers such as fluorocarbon plasma polymers may be formed upon and removed from integrated circuits have been disclosed in the art. For, example, Bariya, in U.S. Pat. No. 5,443,941 discloses a method for removing from a semiconductor substrate a fluorocarbon plasma polymer through an oxygen plasma etching and ashing method.

Desirable in the art are additional methods through which partially fluorinated photoresist layers may be removed from integrated circuits. Particularly desirable are methods through which may be sequentially removed a fluorinated surface layer of a patterned partially fluorinated photoresist layer and a non-fluorinated underlying remainder layer of the patterned partially fluorinated photoresist layer without: (1) damaging integrated circuit layers adjoining the patterned partially fluorinated photoresist layer; (2) forming a residue which impedes the production of a fully functional and reliable integrated circuit; or (3) oxidizing a metal-polymer residue which typically forms upon the sidewall of a via formed through a silicon containing insulator layer to a conductor metal contact beneath the silicon containing insulator layer while employing the patterned partially fluorinated photoresist layer as an etch mask.

SUMMARY OF THE INVENTION

A first object of the present invention is to provide a method for removing from integrated circuits partially fluorinated photoresist layers.

A second object of the present invention is to provide a method in accord with the first object of the present invention, which method also does not damage integrated circuit layers adjoining the partially fluorinated photoresist layers.

A third object of the present invention is to provide a method in accord with the first object of the present invention, which method also leaves no residue which impedes formation of a fully functional or reliable integrated circuit.

A fourth object of the present invention is to provide a method in accord with the first object of the present invention, which method also does not oxidize a metal-polymer residue which typically forms upon sidewalls of vias formed through silicon coming insulator layers to conductor metal contacts while employing the partially fluorinated photoresist layers as etch masks.

A fifth object of the present invention is to provide a method in accord with the first object of the present invention, the second object of the present invention, the third object of the present invention or the fourth object of the present invention, which method is also readily manufacturable.

In accord with the objects of the present invention, there is provided by the present invention a method for removing from an integrated circuit a partially fluorinated photoresist layer. To practice the method of the present invention, there is first provided a semiconductor substrate having formed upon its surface a partially fluorinated photoresist layer. The partially fluorinated photoresist layer has a fluorinated surface layer of the partially fluorinated photoresist layer and an underlying non-fluorinated remainder layer of the partially fluorinated photoresist layer. The fluorinated surface layer of the partially fluorinated photoresist layer is removed through a first etch method. The first etch method employs an oxygen containing plasma at a radio frequency power no greater than about 500 watts and a temperature no greater than about 120 degrees centigrade. The underlying non-fluorinated remainder layer of the partially fluorinated photoresist layer is then removed through a second dry ash or wet strip method.

Through the method of the present invention there may be removed from integrated circuits partially fluorinated photoresist layers while: (1) not damaging integrated circuit layers adjoining the partially fluorinated photoresist layers; (2) not leaving remaining residues which impede formation of fully functional or reliable integrated circuits; or (3) not oxidizing the metal-polymer residues typically formed upon via sidewalls when forming a via through a silicon containing insulator layer to a conductor metal contact while employing the partially fluorinated photoresist layers as etch masks. Through the method of the present invention, there is removed through an oxygen containing plasma method at a power of no greater than about 500 watts and a temperature of no greater than about 120 degrees centigrade the fluorinated surface layer of a partially fluorinated photoresist layer. The underlying non-fluorinated remainder layer of the partially fluorinated photoresist layer may then be removed through a second dry ash or wet strip method. The oxygen plasma method at a power of no greater than about 500 watts and a temperature of no greater than about 120 degrees centigrade effectively removes a fluorinated surface layer of a partially fluorinated photoresist layer without: (1) damaging the integrated circuit layers surrounding the partially fluorinated photoresist layer; (2) leaving a residue which impedes formation of fully functional or reliable integrated circuits; or (3) oxidizing a metal-polymer residue typically formed upon a via sidewall when forming a via through a silicon containing insulator layer to a conductor metal contact while employing the partially fluorinated photoresist layer as an etch mask.

The method of the present invention is readily manufacturable. The method of the present invention employs in removing a fluorinated surface layer of a partially fluorinated photoresist layer an oxygen containing plasma at a radio frequency power of no greater than about 500 watts and a temperature of no greater than about 120 degrees centigrade. After removing the fluorinated surface layer of the partially fluorinated photoresist layer, the underlying non-fluorinated remainder layer of the partially fluorinated photoresist layer may be removed through a second dry ash or wet strip method. The use of plasmas, including oxygen plasmas, is in general known in the art of integrated circuit manufacture. Methods through which such oxygen plasmas or oxygen Reactive Ion Etch (RIE) plasmas may be formed at controlled powers and temperatures are readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for removing from an integrated circuit a partially fluorinated photoresist layer. The partially fluorinated photoresist layer is comprised of a fluorinated surface layer of the partially fluorinated photoresist layer and a non-fluorinated underlying remainder layer of the partially fluorinated photoresist layer. Through the method of the present invention, the fluorinated surface layer of the partially fluorinated photoresist layer is removed through an oxygen containing plasma at a radio frequency power of no greater than about 500 watts and a temperature of no greater than about 120 degrees centigrade. The non-fluorinated underlying remainder layer of the partially fluorinated photoresist layer may then be removed through a second dry ash or wet strip method.

Typically, although not exclusively, the partially fluorinated photoresist layer is fluorinated through a Reactive Ion Etch (RIE) plasma etch method employing a fluorine containing plasma etchant. The Reactive Ion Etch (RIE) method employing the fluorine containing plasma etchant is typically employed in patterning a silicon containing insulator layer, such as a silicon oxide insulator layer, which resides beneath the partially fluorinated photoresist layer. The method of the present invention may, however, also be employed in removing from semiconductor substrates or other integrated circuit layers partially fluorinated photoresist layers which have deliberately or incidentally become partially fluorinated through: (1) exposure to fluorine containing Reactive Ion Etch (RIE) plasma etchants; or (2) other equivalent fluorinating methods.

The method of the present invention may typically be employed in removing partially fluorinated photoresist layers from the surfaces of silicon containing insulator layers within various locations within integrated circuits. The method of the present invention may typically be employed in removing partially fluorinated photoresist layers from silicon containing insulator layers including but not limited to the first insulator layer within an integrated circuit which contacts a semiconductor substrate within an integrated circuit, as well as upper lying insulator layers which separate conductor layers within the integrated circuit.

The method of the present invention may be employed in removing partially fluorinated photoresist layers from insulator layers within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The method of the present invention has broad applicability in removing from insulator layers within various types of integrated circuits partially fluorinated photoresist layers.

Figure 1:
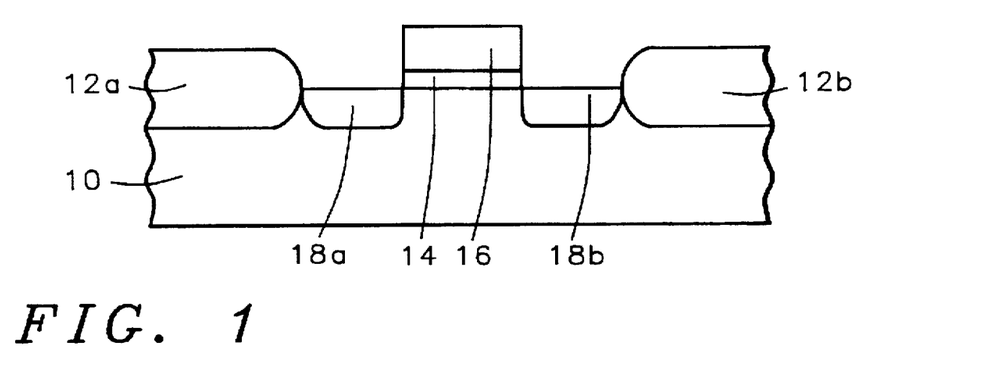
FIG. 1 to FIG. 9 show a series of schematic cross-sectional diagrams illustrating the results of progressive stages in forming an integrated circuit having formed therein multiple patterned silicon containing insulator layers which are patterned through partially fluorinated patterned photoresist layers which are removed from the integrated circuit through the method of the present invention.

Referring now to FIG. 1 to FIG. 9, there is shown a series of schematic cross-sectional diagrams illustrating the results of progressive stages in forming within an integrated circuit multiple patterned silicon containing insulator layers from whose surfaces are removed partially fluorinated patterned photoresist layers through the preferred embodiment of the method of the present invention. Shown in FIG. 1 is a schematic cross-sectional diagram of the integrated circuit at its early stages of fabrication.

Shown in FIG. 1 is a semiconductor substrate 10 having formed within and upon its surface a pair of isolation regions 12a and 12b which define the active region of the semiconductor substrate 10. Formed within and upon the active region of the semiconductor substrate 10 is a Field Effect Transistor (FET) which comprises a gate oxide layer 14 having formed thereupon a gate electrode 16 and a pair of source/drain regions 18a and 18b formed into the active region of the semiconductor substrate 10 at areas not occupied by the gate oxide layer 14 and the gate electrode 16. Each of elements illustrated in FIG. 1 is conventional to the art of integrated circuit manufacture.

For example, although semiconductor substrates are know in the art to have various dopant concentrations, various dopant types and various crystallographic orientations, the semiconductor substrate 10 employed within the preferred embodiments of the method of the present invention is preferably a (100) silicon semiconductor substrate 10 having an N- or P-doping. In addition, while it is also known in the art that isolation regions may be formed within and/or upon semiconductor substrates through methods including but not limited to thermal oxidation methods whereby isolation regions are grown within and upon a semiconductor substrate and isolation region deposition methods whereby isolation regions are formed through patterning of insulator layers deposited upon semiconductor substrates, for the preferred embodiment of the method of the present invention, the isolation regions 12a and 12b are preferably formed through thermal oxidation of portions of the semiconductor substrate 10 exposed through a suitable oxidation mask at a temperature of from about 900 to about 1200 degrees centigrade to form isolation regions 12a and 12b of silicon oxide within and upon the semiconductor substrate 10.

Finally, with respect to the components which form the Field Effect Transistor (FET) formed within and upon the active region of the semiconductor substrate 10, it is known in the art that: (1) gate oxide layers may be formed through methods including but not limited to thermal oxidation methods whereby the surfaces of active regions of semiconductor substrates are oxidized to form gate oxide layers and methods whereby gate oxide layers are independently formed upon the surfaces of active regions of semiconductor substrates; (2) gate electrodes are typically formed upon gate oxide layers through patterning through methods as are conventional in the art of blanket layers of gate electrode materials formed of conductive materials including but not limited to metals, metal alloys and highly doped polysilicon; and (3) source/drain regions are typically formed within semiconductor substrates through ion implantation methods employing dopant species of polarity suitable to the polarity of the Metal Oxide Semiconductor Field Effect Transistor (MOSFET) desired to be formed.

Thus, for the preferred embodiment of the method of the present invention, the gate oxide layer 14 is preferably formed through patterning through methods as are conventional in the art of a blanket gate oxide layer formed through thermal oxidation of the active region of the semiconductor substrate 10 at a temperature of about 900 to about 1200 degrees centigrade. Similarly, the gate electrode 16 is preferably formed through patterning through methods as are conventional in the art of a highly doped polysilicon layer formed upon the blanket gate oxide layer through a Chemical Vapor Deposition (CVD) method employing silane as the silicon source material, along with suitable dopants. Finally, the source/drain electrode regions 18a and 18b are preferably formed through implanting a suitable dopant into the active region of the semiconductor substrate 10 at an ion implantation dose of from about 1E15 to about 1E16 ions per square centimeter and an ion implantation energy of from about 30 to about 40 keV.

Figure 2:
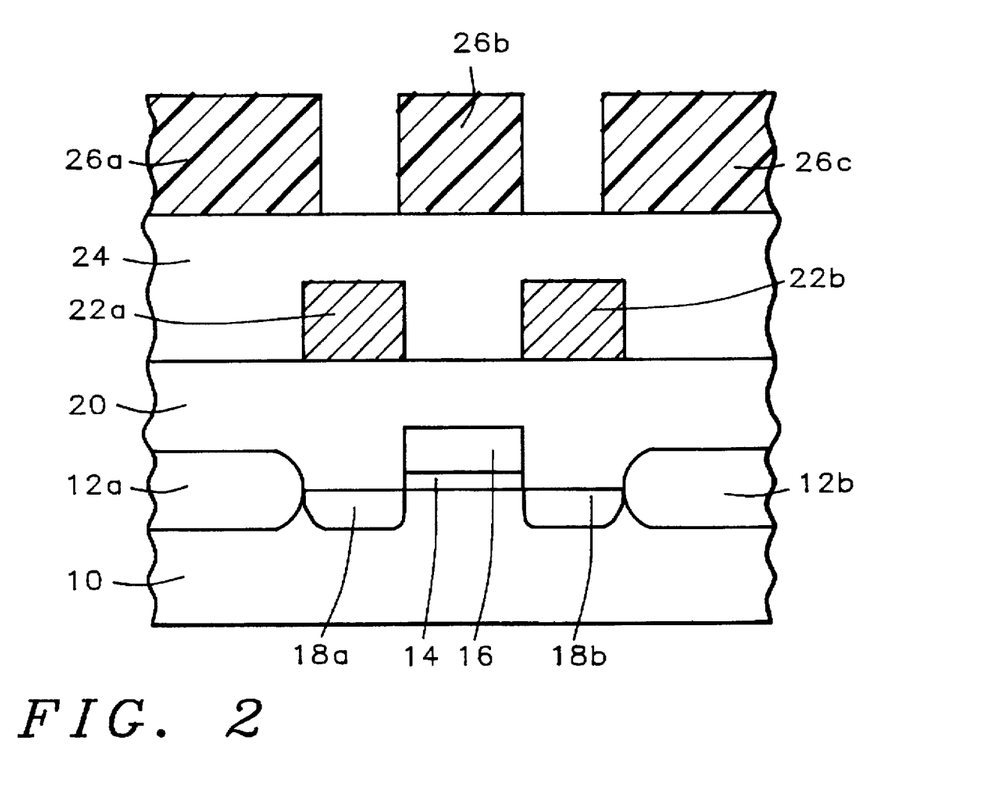

Referring now to FIG. 2, there is shown a schematic cross-sectional diagram illustrating the results of further processing of the integrated circuit whose schematic cross-sectional diagram is illustrated in FIG. 1. Shown in FIG. 2 is a planarized Pre-Metal Dielectric (PMD) layer 20 formed upon the integrated circuit whose schematic cross-sectional diagram is illustrated in FIG. 1. Planarized Pre-Metal Dielectric (PMD) layers are known in the art of integrated circuit manufacture. Planarized Pre-Metal Dielectric (PMD) layers are typically formed through planarizing through methods as are conventional in the art of conformal Pre-Metal Dielectric (PMD) layers which are commonly formed within integrated circuits from dielectric materials including but not limited to silicon oxide dielectric materials, silicon nitride dielectric materials and silicon oxynitride materials. Conformal Pre-Metal Dielectric (PMD) layers may be formed through methods including but not limited to Chemical Vapor Deposition (CVD) methods, Plasma Enhanced Chemical Vapor Deposition (PECVD) methods and Physical Vapor Deposition (PVD) sputtering methods, and planarized through methods as are conventional in the art, including but not limited to Reactive Ion Etch (RIE) etch-back planarizing methods and Chemical Mechanical Polish (CMP) planarizing methods. For the preferred embodiment of the method of the present invention, the Planarized Pre-Metal Dielectric (PMD) layer 20 is preferably: (1) formed from a silicon oxide dielectric material deposited conformally upon the semiconductor substrate 10 through a Plasma Enhanced Chemical Vapor Deposition (PECVD) method; and (2) planarized through a Chemical Mechanical Polish (CMP) planarizing method, as is common in the art. Preferably, the planarized Pre-Metal Dielectric (PMD) layer 20 is from about 5000 to about 15000 angstroms thick.

As is also illustrated in FIG. 2, there is formed upon the planarized Pre-Metal Dielectric (PMD) layer 20 a pair of patterned first conductor layers 22a and 22b. The patterned first conductor layers 22a and 22b are preferably formed through patterning through methods as are conventional in the art of a blanket first conductor layer. As is known in the art, blanket conductor layers within integrated circuits may be formed through methods including but not limited to thermal evaporation methods, Physical Vapor Deposition (PVD) sputtering methods and Chemical Vapor Deposition (CVD) methods through which may be formed blanket conductor layers of conductor materials including but not limited to metals, metal alloys and polysilicon. For the preferred embodiment of the method of the present invention, the patterned first conductor layers 22a and 22b are preferably formed through patterning through methods as are conventional in the art of a blanket first conductor layer formed at least in part of aluminum or an aluminum alloy, as is common in the art. Preferably, the patterned first conductor layers 22a and 22b are from about 3000 to about 10000 angstroms thick each.

As is also illustrated in FIG. 2, there is formed upon the exposed portions of the planarized Pre-Metal Dielectric (PMD) layer 20 and the patterned first conductor layers 22a and 22b, a planarized first Inter-Metal Dielectric (IMD) layer 24. The planarized first Inter-Metal Dielectric (IMD) layer 24 is preferably formed through methods and materials analogous to the methods and materials employed in forming the planarized Pre-Metal Dielectric (PMD) layer 20. Preferably, the planarized first Inter-Metal Dielectric (IMD) layer 24 is from about 6000 to about 12000 angstroms thick.

Finally, there is also shown in FIG. 2 the presence of patterned first photoresist layers 26a, 26b and 26c formed upon the surface of the planarized first Inter-Metal Dielectric (IMD) layer 24. The patterned first photoresist layers 26a, 26b and 26c are formed through patterning through methods as are conventional in the art of a blanket first photoresist layer. Several photoresist materials from which may be formed blanket photoresist layers are known in the art of integrated circuit manufacture. Such photoresist materials include but are not limited to novolak photoresist materials and Poly-Methyl-Meth-Acrylate (PMMA) photoresist materials. While either of the foregoing photoresist materials, or many other photoresist materials, may be employed in forming the patterned first photoresist layers 26a, 26b and 26c within the preferred embodiment of the method of the present invention, the preferred embodiment of the method of the present invention provides value in removing a fluorinated surface layer of a partially fluorinated patterned photoresist layer when the patterned photoresist layers are formed from a photoresist material which is susceptible to fluorination in a Reactive Ion Etch (RIE) plasma formed from a fluorine containing plasma etchant. Thus, for the preferred embodiment of the method of the present invention, the patterned first photoresist layers 26a, 26b and 26c are preferably formed of a photoresist material which is susceptible to fluorination in a Reactive Ion Etch (RIE) plasma formed from a fluorine containing plasma etchant which is employed in patterning the planarized first Inter-Metal Dielectric (IMD) layer 24 while employing the patterned first photoresist layers 26a, 26b and 26c as a mask. Preferably, the patterned first photoresist layers 26a, 26b and 26c are from about 2000 to about 14000 angstroms thick each, and the apertures between the corresponding patterned first photoresist layers 26a and 26b and the corresponding patterned first photoresist layers 26b and 26c are typically from about 4000 to about 10000 angstroms in width, thus exposing the surface of the planarized first Inter-Metal Dielectric (IMD) layer 24.

Figure 3:
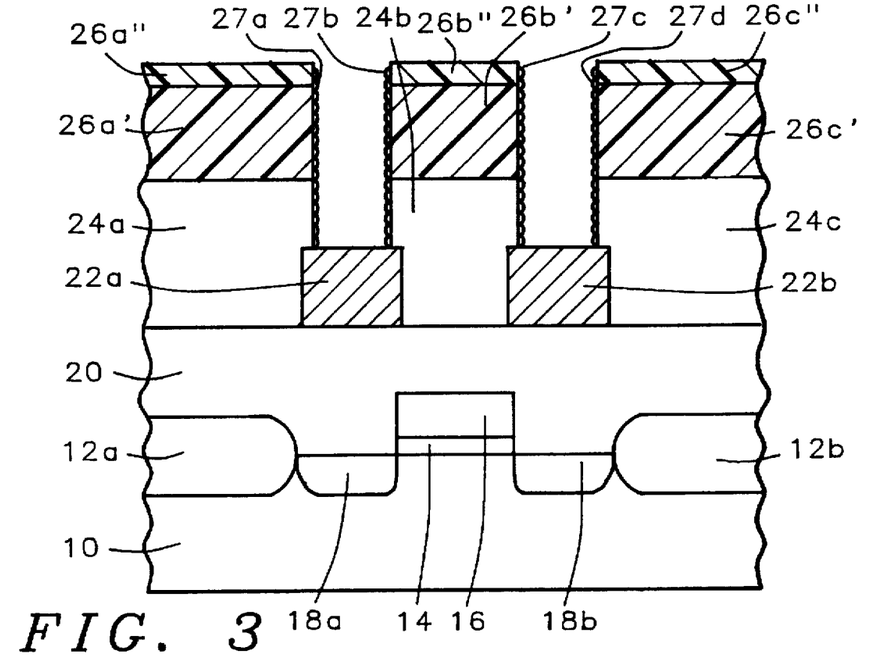

Referring now to FIG. 3, there is shown a schematic cross-sectional diagram illustrating the results of further processing of the integrated circuit whose schematic cross-sectional diagram is illustrated in FIG. 2. Shown in FIG. 3 is the presence of the patterned planarized first Inter-Metal Dielectric (IMD) layers 24a, 24b and 24c which are formed through patterning while employing a fluorine containing etchant within a Reactive Ion Etch (RIE) plasma etch method the planarized first Inter-Metal Dielectric (IMD) layer 24. The planarized first Inter-Metal Dielectric (IMD) layer 24 is preferably patterned until there is reached the surfaces of the patterned first conductor layers 22a and 22b. The fluorine containing etchant within the Reactive Ion Etch (RIE) plasma etch method is preferably chosen from the group of fluorine containing etchants consisting of C1–C3 per-fluorocarbons (ie: per-fluorocarbons having no greater than three carbon atoms), C1–C3 hydro-fluorocarbons (ie: hydro-fluorocarbons having no greater than three carbon atoms) and nitrogen trifluoride. The Reactive Ion Etch (RIE) plasma etch method employing the fluorine containing plasma etchant is preferably undertaken at a fluorine containing etchant flow rate of from about 20 to about 80 standard cubic centimeters per minute (sccm), a radio frequency power of from about 500 to about 1400 watts, a reactor chamber pressure of from about 200 to about 600 mtorr, an argon flow rate of from about 200 to about 600 standard cubic centimeters per minute (sccm), a background helium flow rate or from about 7 to about 20 standard cubic centimeters per minute (sccm) and a substrate temperature of from about −10 to about 10 degrees centigrade.

Also shown in FIG. 3 is the presence of: (1) the patterned first fluorinated surface photoresist layers 26a", 26b" and 26c"; and (2) the patterned first non-fluorinated underlying photoresist layers 26a', 26b' and 26c' which are simultaneously formed from the patterned first photoresist layers 26a, 26b and 26c when the planarized first Inter-Metal Dielectric layer 24 is patterned to form the patterned planarized first Inter-Metal Dielectric (IMD) layers 24a, 24b and 24c. Under the fluorine coming plasma etchant Reactive Ion Etch (RIE) etch conditions outlined for the preferred embodiment of the method of the present invention, the patterned first fluorinated surface photoresist layers 26a", 26b" and 26c" will typically be from about 200 to about 3000 angstroms thick and the patterned first non-fluorinated underlying photoresist layers 26a', 26b' and 26c' will typically be from about 1800 to about 11000 angstroms thick.

Finally, there is shown in FIG. 3 the presence of first metal-polymer residues 27a, 27b, 27c and 27d formed upon the sidewalls of the vias etched to the surfaces of the patterned first conductor layers 22a and 22b when forming the patterned planarized first Inter-Metal Dielectric (IMD) layers 24a, 24b and 24c. The first metal-polymer residues 27a, 27b, 27c and 27d are typically formed during over-etching of the patterned first conductor layers 22a and 22b in order to assure adequate contact to the patterned first conductor layers 22a and 22b. Metal-polymer residues such as the metal-polymer residues 27a, 27b, 27c and 27d are typically not easily removable through conventional high power and high temperature oxygen ashing since such conventional high power and high temperature oxygen ashing typically oxidizes the metal-polymer residue to form a metal oxide-polymer residue which strongly adheres to via sidewalls upon which it is formed.

Figure 4:
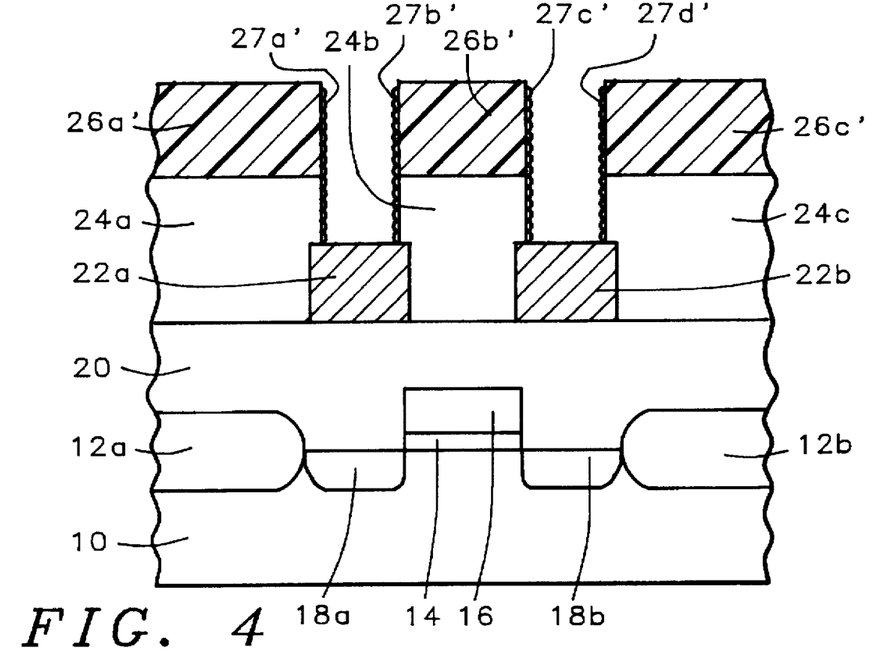

Referring now to FIG. 4, there is shown a schematic cross-sectional diagram illustrating the results of further processing of the integrated circuit whose schematic cross-sectional diagram is illustrated in FIG. 3. Shown in FIG. 4 is a schematic cross-sectional diagram of an integrated circuit otherwise equivalent to the integrated circuit whose schematic cross-sectional diagram is illustrated in FIG. 3, but from whose surface has been removed: (1) the patterned first fluorinated surface photoresist layers 26a", 26b" and 26c"; and (2) portions of the first metal-polymer residues 27a, 27b, 27c and 27d to form the partial first metal-polymer residues 27a', 27b', 27c' and 27d'. In order to remove the patterned first fluorinated surface photoresist layers 26a", 26b" and 26c" without: (1) damaging the patterned first Inter-Metal Dielectric (IMD) layers 24a, 24b and 24c or the patterned first conductor layers 22a and 22b, or (2) oxidizing the partial first metal-polymer residues 27a', 27b', 27c' and 27d', it has been found experimentally that an oxygen containing plasma at a comparatively low power and low temperature is preferably employed. Preferably the power of the oxygen containing plasma is no greater than about 500 watts at a radio frequency of 13.56 MHz. Preferably, the temperature is no greater than about 120 degrees centigrade. The oxygen containing plasma through which is removed the patterned first fluorinated surface photoresist layers 26a", 26b" and 26c" while simultaneously forming the partial first metal-polymer residues 27a', 27b', 27c' and 27d' may be a pure oxygen plasma, or the oxygen containing plasma may alternatively be an oxygen containing plasma having other components such as, but not limited to, nitrogen. Preferably, the oxygen containing plasma contains at least about 70 percent oxygen. Other parameters under which is preferably provided the oxygen containing plasma for removing the patterned first fluorinated surface photoresist layers 26a", 26b" and 26c" while simultaneously forming the partial first metal-polymer residues 27a', 27b', 27c' and 27d' include a reactor chamber pressure of from about 3 to about 4 torr and a total gas flow rate of from about 4000 to about 5000 standard cubic centimeters per minute (sccm). Preferably, the patterned first fluorinated surface photoresist layers 26a", 26b" and 26c" are exposed the oxygen containing plasma at comparitively low power and low temperature for a time period sufficient to completely remove the patterned first fluorinated surface photoresist layers 26a", 26b" and 26c". For the thickness range disclosed for the preferred embodiment of the method of the present invention, an exposure time of the patterned first fluorinated surface photoresist layers 26a", 26b" and 26c" to the oxygen containing plasma of from about 0.5 to about 2 minutes is typical.

Figure 5:
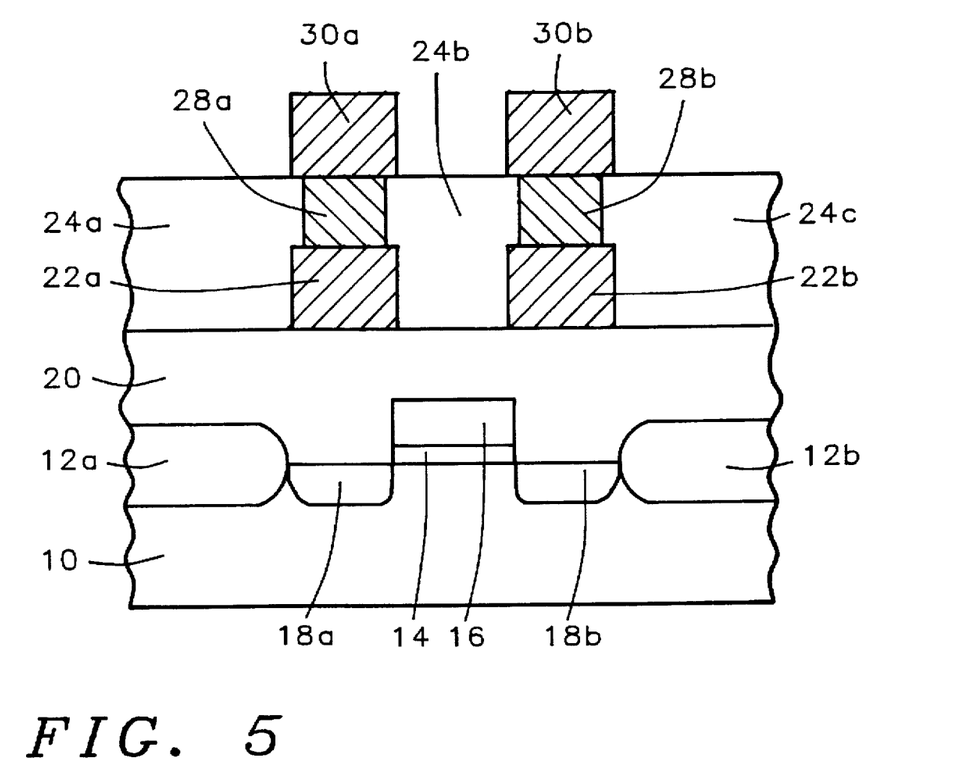

Referring now to FIG. 5, there is shown a schematic cross-sectional diagram illustrating the results of further processing of the integrated circuit whose schematic cross-sectional diagram is illustrated in FIG. 4. Shown in FIG. 5 is a schematic cross-sectional diagram of an integrated circuit analogous to the integrated circuit whose schematic cross-sectional diagram is illustrated in FIG. 4, but from whose surface has been removed: (1) the patterned first non-fluorinated underlying photoresist layers 26a', 26b' and 26c'; and (2) the partial first metal-polymer residues 27a', 27b', 27c' and 27d'. For the preferred embodiment of the method of the present invention, the patterned first non-fluorinated underlying photoresist layers 26a', 26b' and 26c' and the partial first metal-polymer residues 27a', 27b', 27c' and 27d' may be removed through etch methods as are conventional in the art, including but not limited to wet chemical etch methods, dry plasma etch methods and combinations of wet chemical etch methods and dry plasma etch methods. The wet chemical etch methods typically employ a solvent composition which readily dissolves the patterned first non-fluorinated underlying photoresist layers 26a', 26b' and 26c' as well as the partial first metal-polymer residues 27a', 27b, 27c' and 27d'. The dry plasma stripping methods typically employ an oxygen containing plasma at substantially higher power and temperature in comparison with the oxygen containing plasma employed in removing the patterned first fluorinated surface photoresist layers 26a", 26b" and 26c". Typically, an oxygen containing plasma employed in removing the patterned first non-fluorinated underlying photoresist layers 26a', 26b' and 26c' is undertaken at a power of from about 500 to about 1300 watts at a radio frequency of 13.56 MHz and a temperature of about 150 to about 350 degrees centigrade, with remaining parameters equivalent to the parameters employed in removing the patterned first fluorinated surface photoresist layers 26a", 26b" and 26c". Under these conditions of power and temperature, the patterned first non-fluorinated underlying photoresist layers 26a', 26b' and 26c' of the disclosed thicknesses, as well as the partial first metal-polymer residues 27a', 27b', 27c' and 27d', are typically removed within an exposure time to the higher temperature and higher pressure oxygen plasma of from about 10 to about 30 minutes within a typical batch-type oxygen plasma asher.

Also shown in FIG. 5 is the presence of: (1) a pair of first conductive interconnection studs 28a and 28b formed into the apertures between the patterned planarized first Inter Metal Dielectric (IMD) layers 24a, 24b and 24c; and (2) a pair of patterned second conductor layers 30a and 30b formed upon the surfaces of the patterned planarized first Inter-Metal Dielectric (IMD) layers 24a, 24b and 24c and contacting the pair of patterned first conductive interconnection studs 28a and 28b. Methods and materials through which conductive interconnection studs may be formed within integrated circuits are known in the art of integrated circuit manufacture. Conductive interconnection studs within integrated circuits may be formed of conductive materials including but no limited to metals, metal alloys and highly doped polysilicon formed into apertures between patterned Inter-Metal Dielectric (IMD) layers through methods including but not limited to thermal evaporation methods, Chemical Vapor Deposition (CVD) methods and Physical Vapor Deposition (PVD) sputtering methods. For the preferred embodiment of the method of the present invention, the pair of first conductive interconnection studs 28a and 28b is preferably formed at least in part of tungsten metal deposited through a Chemical Vapor Deposition (CVD) method, as is common in the art. The pair of first conductive interconnection studs 28a and 28b is preferably formed to a thickness sufficient to reach the upper surfaces of the patterned planarized first Inter-Metal Dielectric (IMD) layers 24a, 24b and 24c, while making contact with the patterned first conductor layers 22a and 22b. For the preferred embodiment of the method of the present invention, the patterned second conductor layers 30a and 30b are preferably formed through methods, materials and dimensions analogous to the methods, materials and dimensions employed in forming the patterned first conductor layers 22a and 22b.

As is understood by a person skilled in the art, the method of the present invention may be employed in removing fluorinated surface photoresist layers formed from fluorinating patterned photoresist layers employed in patterning silicon containing dielectric layers other than the planarized first Inter-Metal Dielectric layer 24 as illustrated in FIG. 1 to FIG. 5. In that regard, there is shown in FIG. 6 to FIG. 9 is a series of schematic cross-sectional diagrams illustrating the results of progressive process steps in patterning a planarized second Inter-Metal Dielectric (IMD) layer 32 within the integrated circuit whose schematic cross-sectional diagrams is illustrated by FIG. 1 to FIG. 5.

Figure 6:
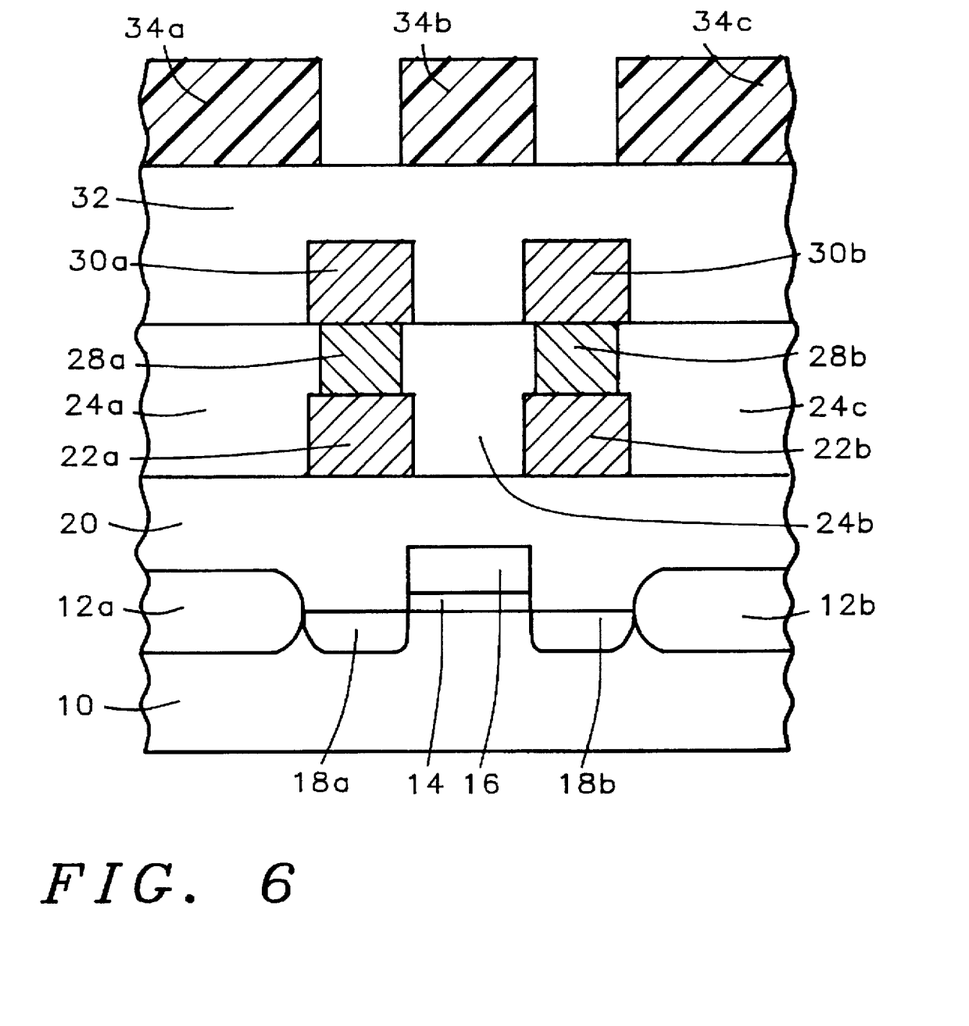

Analogously with FIG. 2, FIG. 6 shows a planarized second Inter-Metal Dielectric (IMD) layer 32 formed upon the exposed portions of the patterned planarized first Inter-Metal Dielectric (IMD) layers 24a, 24b and 24c, and the pair of patterned second conductor layers 30a and 30b. Also analogously with FIG. 2, FIG. 6 shows a series of patterned second photoresist layers 34a, 34b and 34c formed upon the surface of the planarized second Inter-Metal Dielectric (IMD) layer 32. The planarized second Inter-Metal Dielectric layer 32 is preferably formed through methods, materials and dimensions analogous to the methods, materials and dimensions employed in forming the planarized first Inter-Metal Dielectric (IMD) layer 24. The patterned second photoresist layers 34a, 34b and 34c are preferably formed through methods, materials and dimensions analogous to the methods, materials and dimensions employed in forming the patterned first photoresist layers 26a, 26b and 26c.

Figure 7:
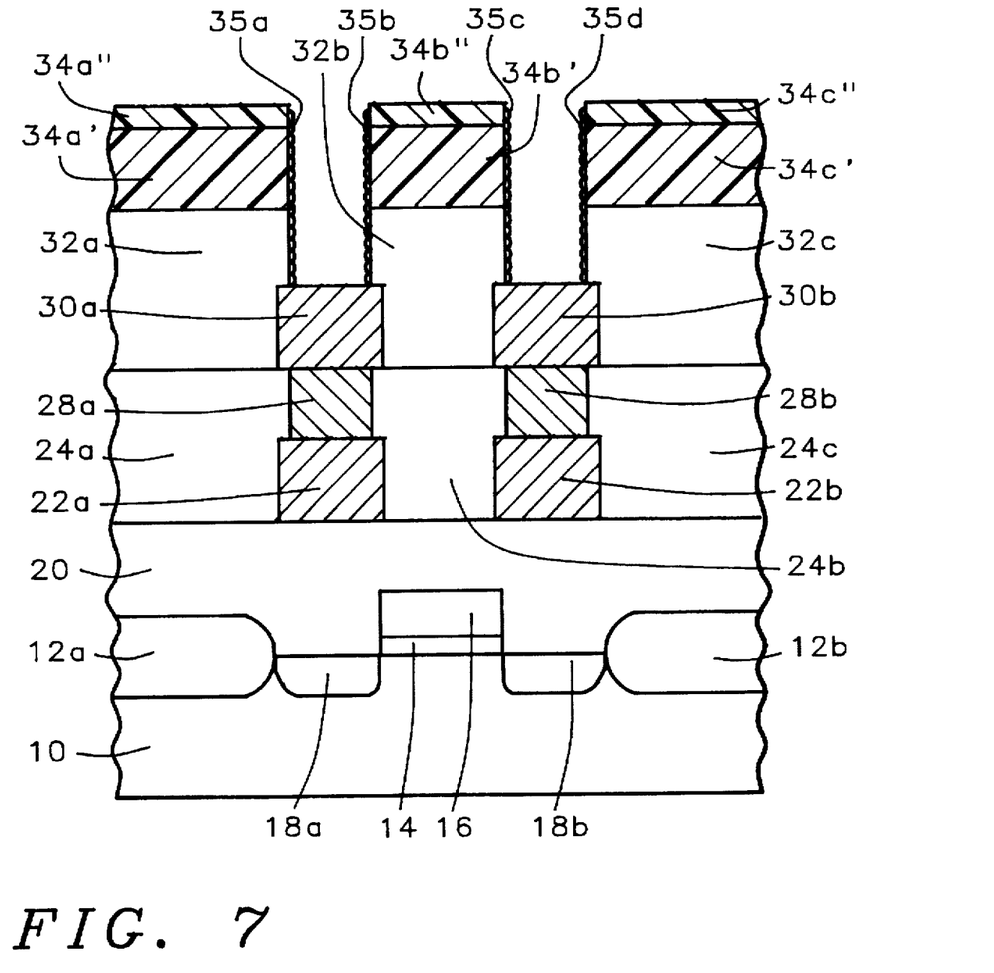

Referring now to FIG. 7, there is shown a schematic cross-sectional diagram illustrating the results of further processing of the integrated whose schematic cross-sectional diagram is illustrated in FIG. 6. Analogously with FIG. 3, FIG. 7 shows the results of patterning the planarized second Inter-Metal Dielectric (IMD) layer 32 to form the patterned planarized second Inter-Metal Dielectric (IMD) layers 32a, 32b and 32c through a fluorine containing plasma Reactive Ion Etch (RIE) plasma etch method. The patterned planarized second Inter-Metal Dielectric (IMD) layers 32a, 32b and 32c are patterned until there is reached the surfaces of the pair of patterned second conductor layers 30a and 30b. Simultaneously with forming the patterned planarized second Inter-Metal Dielectric (IMD) layers 32a, 32b and 32c, there is formed from the patterned second photoresist layers 34a, 34b and 34c the patterned second fluorinated surface photoresist layers 34a", 34b" and 34c" and the patterned second non-fluorinated underlying photoresist layers 34a', 34b' and 34c'. There is also simultaneously formed the second metal-polymer residues 35a, 35b, 35c and 35d. The patterned planarized second Inter-Metal Dielectric (IMD) layers 32a, 32b and 32c, the patterned second fluorinated surface photoresist layers 34a", 34b" and 34c", the patterned second non-fluorinated underlying photoresist layers 34a', 34b' and 34c' and the second metal-polymer residues 35a, 35b, 35c and 35d are formed through a fluorine containing Reactive Ion Etch (RIE) method analogous to the fluorine containing Reactive Ion Etch (RIE) method employed in forming the patterned planarized first Inter-Metal Dielectric (IMD) layers 24a, 24b and 24c, the patterned first fluorinated surface photoresist layers 26a", 26b" and 26c", the patterned first non-fluorinated underlying photoresist layers 26a', 26b' and 26c' and the first metal-polymer residues 27a, 27b, 27c and 27d.

Figure 8:
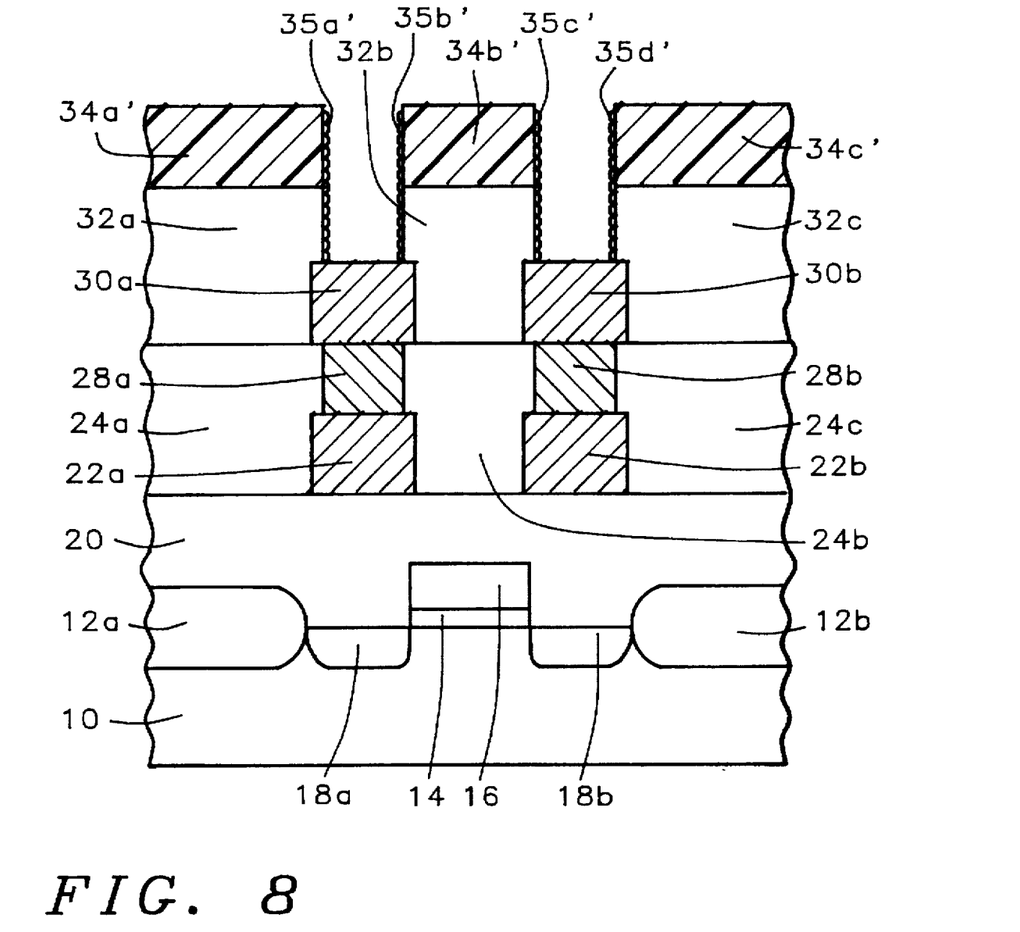

Referring now to FIG. 8, there is shown a schematic cross-sectional diagram illustrating the results of further processing of the integrated circuit whose schematic cross-sectional diagram is illustrated in FIG. 7. Shown in FIG. 8 is a schematic cross-sectional diagram of an integrated circuit otherwise equivalent to the integrated circuit whose schematic cross-sectional diagram illustrated in FIG. 7, but from whose surface has been removed the patterned second fluorinated surface photoresist layers 34a", 34b" and 34c" while simultaneously forming the partial second metal-polymer residues 35a', 35b', 35c' and 35d' from the second metal-polymer residues 35a, 35b, 35c and 35d. The patterned second fluorinated surface photoresist layers 34a", 34b" and 34c" are removed and the partial second metal-polymer residues 35a', 35b', 35c' and 35d' are formed employing a comparatively low power and low temperature oxygen containing plasma under equivalent conditions to the comparatively low power and low temperature oxygen containing plasma employed in removing the patterned first fluorinated surface photoresist layers 26a", 26b" and 26c" while simultaneously forming the partial first metal-polymer residues 27a', 27b', 27c' and 27d' within the integrated circuit whose schematic cross-sectional diagram is illustrated in FIG. 4.

Figure 9:
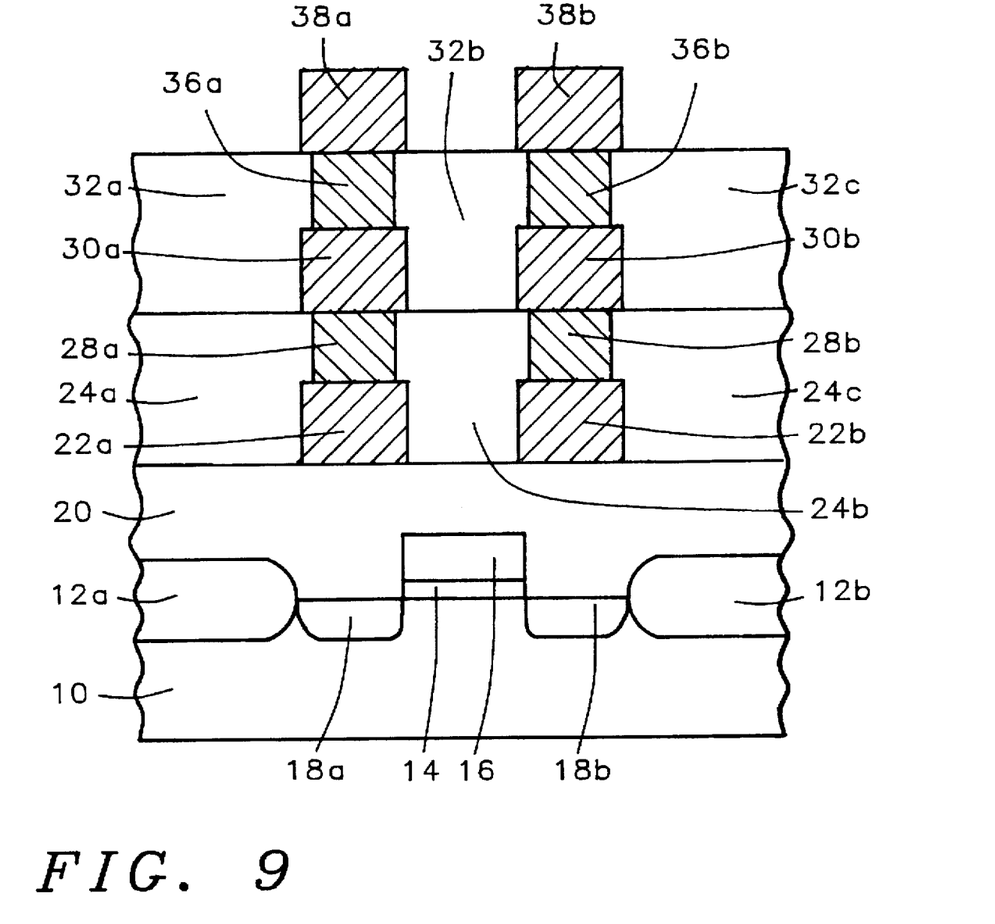

Referring now to FIG. 9, there is shown a schematic cross-sectional diagram illustrating the results of further processing of the integrated circuit whose schematic cross-sectional diagram is illustrated in FIG. 8. Shown in FIG. 9 is a schematic cross-sectional diagram of an integrated circuit analogous to the integrated circuit whose schematic cross-sectional diagram is illustrated in FIG. 8, but from whose surface has been removed: (1) the patterned second non-fluorinated underlying photoresist layers 34a', 34b' and 34c'; and (2) the partial second metal-polymer residues 35a', 35b', 35c' and 35d'. In addition, there is also shown within FIG. 9 a pair of second conductive interconnection studs 36a and 36b formed within the apertures between the patterned planarized second Inter-Metal Dielectric (IMD) layers 32a, 32b and 32c and a pair of patterned third conductor layers 38a and 38b formed upon the surfaces of the patterned planarized second Inter-Metal Dielectric (IMD) layers 32a, 32b and 32c while simultaneously contacting the pair of second conductive interconnection studs 36a and 36b.

The patterned second non-fluorinated underlying photoresist layers 34a', 34b' and 34c' are removed through methods and materials equivalent to the methods and materials employed in removing the patterned first non-fluorinated underlying photoresist layers 26a', 26b' and 26c' from the corresponding patterned planarized first Inter-Metal Dielectric (IMD) layers 24a, 24b and 24c. The pair of second conductive interconnection studs 36a and 36b is formed through methods, materials and dimensions equivalent to the methods, materials and dimensions employed in forming the pair of first conductive interconnection studs 28a and 28b. Finally, the pair of patterned third conductor layers 38a and 38b is formed through methods, materials and dimensions equivalent to the methods, materials and dimensions employed in forming the patterned second conductor layers 30a and 30b and the patterned first conductor layers 22a and 22b.

Upon forming the patterned third conductor layers 38a and 38b, there is formed through the preferred embodiment of the method of the present invention an integrated circuit having formed therein multiple patterned silicon containing insulator layers within which are formed conductive interconnection studs which interconnect patterned metal layers. The patterned silicon containing insulator layers are patterned employing a patterned photoresist layer and a fluorine containing Reactive Ion Etch (RIE) plasma which simultaneously forms a fluorinated surface layer of the patterned photoresist layer. Through the method of the present invention, the fluorinated surface layer of the patterned photoresist layer is removed through a soft ashing plasma etch method employing an oxygen containing plasma at a comparatively low power and low temperature. By employing the oxygen containing plasma at the comparatively low power and low pressure the fluorinated surface layer of the patterned photoresist layer is removed without: (1) damaging other layers which adjoin the fluorinated surface layer; (2) forming a residue which impedes the formation of fully functional or reliable integrated circuits; or (3) oxidizing a metal-polymer residue which typically forms upon sidewalls of vias formed through silicon containing insulator layers to conductor metal contacts while employing the patterned photoresist layer as an etch mask.

As is understood by a person skilled in the art, the preferred embodiment of the method of the present invention is illustrative of the method of the present invention rather than limiting of the method of the present invention. Revisions may be made to methods, materials, structures and dimensions through which is undertaken the preferred embodiment of the method of the present invention while still providing an embodiment which is within the spirit and scope of the present invention, as defined by the accompanying Claims.

What is claimed is:

1. A method for removing from a semiconductor substrate a partially fluorinated photoresist layer comprising:

forming over a semiconductor substrate a partially fluorinated photoresist layer, the partially fluorinated photoresist layer having a fluorinated surface layer and an underlying non-fluorinated remainder layer;

removing the fluorinated surface layer through a first etch method, the first etch method employing an oxygen containing plasma at a radio frequency power no greater than about 500 watts and a temperature no greater than about 120 degrees centigrade; and removing then the underlying non-fluorinated remainder layer through a second etch method.

2. The method of claim 1 wherein:

the thickness of the partially fluorinated photoresist layer is from about 2000 to about 14000 angstroms;

the thickness of the fluorinated surface layer of the partially fluorinated photoresist layer is from about 200 to about 3000 angstroms; and the thickness of the non-fluorinated remainder layer of the partially fluorinated photoresist layer is from about 1800 to about 11000 angstroms.

3. The method of claim 1 wherein the partially fluorinated photoresist layer is formed from a photoresist material chosen from the group of photoresist materials consisting of novolak photoresist materials and Poly Methyl Meth Acrylate (PMMA) photoresist materials.

4. The method of claim 1 wherein the partially fluorinated photoresist layer is fluorinated through a Reactive Ion Etch (RIE) method employing a fluorine containing Reactive Ion Etch (RIE) plasma etchant at a radio frequency power of from about 500 to about 1400 watts.

5. The method of claim 4 wherein the fluorine containing Reactive Ion Etch (RIE) plasma etchant is chosen from the group of fluorine containing plasma etchants consisting of per-fluorocarbons having no greater than three carbon atoms, hydro-fluorocarbons having no greater than three carbon atoms and nitrogen trifluoride.

6. The method of claim 1 wherein the oxygen containing plasma is an oxygen plasma.

7. The method of claim 1 wherein the oxygen containing plasma is an oxygen-nitrogen plasma containing at least about 70 percent oxygen.

8. A method for removing from an integrated circuit layer formed upon a semiconductor substrate a partially fluorinated photoresist layer formed upon the integrated circuit layer comprising:

forming over a semiconductor substrate an integrated circuit layer;

forming upon the integrated circuit layer a partially fluorinated photoresist layer, the partially fluorinated photoresist layer having a fluorinated surface layer and an underlying non-fluorinated remainder layer;

removing the fluorinated surface layer through a first etch method, the first etch method employing an oxygen containing plasma at a radio frequency power no greater than about 500 watts and a temperature no greater than about 120 degrees centigrade; and removing then the underlying non-fluorinated remainder layer through a second etch method.

9. The method of claim 8 wherein:

the thickness of the partially fluorinated photoresist layer is from about 2000 to about 14000 angstroms;

the thickness of the fluorinated surface layer of the partially fluorinated photoresist layer is from about 200 to about 3000 angstroms; and the thickness of the non-fluorinated remainder layer of the partially fluorinated photoresist layer is from about 1800 to about 11000 angstroms.

10. The method of claim 8 wherein the partially fluorinated photoresist layer is formed from a photoresist material chosen from the group of photoresist materials consisting of novolak photoresist materials, Poly Methyl Meth Acrylate (PMMA) photoresist materials.

11. The method of claim 8 wherein the partially fluorinated photoresist layer is fluorinated through a Reactive Ion Etch (RIE) method employing a fluorine containing Reactive Ion Etch (RIE) plasma etchant at a radio frequency power of from about 500 to about 1400 watts.

12. The method of claim 11 wherein the fluorine containing Reactive Ion Etch (RIE) plasma etchant is chosen from the group of plasma etchants consisting of per-fluorocarbons having no greater than three carbon atoms, hydro-fluorocarbons having no greater than three carbon atoms and nitrogen trifluoride.

13. The method of claim 8 wherein the oxygen containing plasma is an oxygen plasma.

14. The method of claim 8 wherein the oxygen containing plasma is an oxygen-nitrogen plasma containing at least about 70 percent oxygen.

15. A method for removing from a patterned silicon oxide insulator layer within an integrated circuit a patterned partially fluorinated photoresist layer employed in patterning the patterned silicon oxide insulator layer comprising:

forming over a semiconductor substrate a silicon oxide insulator layer, the semiconductor substrate having integrated circuit devices formed therein and thereupon;

forming upon the silicon oxide insulator layer a patterned photoresist layer;

patterning through the patterned photoresist layer as an etch mask, and by use of a Reactive Ion Etch (RIE) plasma etch method employing a fluorine containing plasma etchant, the silicon oxide insulator layer to form a patterned silicon oxide insulator layer, the Reactive Ion Etch (RIE) plasma etch method simultaneously forming from the patterned photoresist layer a partially fluorinated patterned photoresist layer comprising a patterned fluorinated surface layer and a patterned non-fluorinated underlying remainder layer;

removing the patterned fluorinated surface layer through a first etch method, the first etch method employing an oxygen containing plasma at a radio frequency power no greater than about 500 watts and a temperature no greater than about 120 degrees centigrade; and removing then the patterned non-fluorinated underlying remainder layer through a second etch method.

16. The method of claim 15 wherein:

the thickness of the patterned photoresist layer is from about 2000 to about 14000 angstroms;

the thickness of the fluorinated surface layer of the patterned photoresist layer is from about 200 to about 3000 angstroms; and the thickness of the non-fluorinated remainder layer of the patterned photoresist layer is from about 1800 to about 11000 angstroms.

17. The method of claim 15 wherein the patterned photoresist layer is formed from a photoresist material chosen from the group of photoresist materials consisting of novolak photoresist materials and Poly Methyl Meth Acrylate (PMMA) photoresist materials.

18. The method of claim 15 wherein the patterned photoresist layer is partially fluorinated through exposure to the fluorine containing plasma etchant at a radio frequency power of from about 500 to about 1400 watts.

19. The method of claim 15 wherein the fluorine containing plasma etchant is chosen from the group of plasma etchants consisting of per-fluorocarbons having no greater than three carbon atom, hydro-fluorocarbons having no greater than three carbon atoms and nitrogen trifluoride.

20. The method of claim 15 wherein the oxygen containing plasma is an oxygen plasma.

21. The method of claim 15 wherein the oxygen containing plasma is an oxygen-nitrogen plasma containing at least about 70 percent oxygen.

22. The method of claim 15 wherein the second etch method is chosen from the group of etch methods consisting of wet chemical etch methods, dry plasma etch methods and combinations of wet chemical etch methods and dry plasma etch methods.

23. The method of claim 15 wherein the second etch method employs:

an oxygen containing Reactive Ion Etch (RIE) plasma at a power of from about 500 to about 1300 watts at a radio frequency of 13.56 MHZ; and a temperature of from about 150 to about 350 degrees centigrade.

24. The method of claim 15 wherein a conductor metal contact formed beneath the silicon oxide insulator layer is reached when the silicon oxide layer is patterned to yield the patterned silicon oxide insulator layer.

* * * * *